United States Patent
Kawasaki et al.

(10) Patent No.: US 8,362,574 B2
(45) Date of Patent: Jan. 29, 2013

(54) FACETED EPI SHAPE AND HALF-WRAP AROUND SILICIDE IN S/D MERGED FINFET

(75) Inventors: Hirohisa Kawasaki, Ballston Spa, NY (US); Chung-hsun Lin, Yorktown Heights, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 216 days.

(21) Appl. No.: 12/794,151

(22) Filed: Jun. 4, 2010

(65) Prior Publication Data

US 2011/0298058 A1    Dec. 8, 2011

(51) Int. Cl.
  H01L 27/085    (2006.01)
  H01L 21/70    (2006.01)
(52) U.S. Cl. ......... 257/401; 257/E21.532; 257/E27.059; 438/478; 438/197
(58) Field of Classification Search .......... 257/401, 257/E21.532, E27.059; 438/197, 478
See application file for complete search history.

(56) References Cited

U.S. PATENT DOCUMENTS

| | | | |
|---|---|---|---|
| 6,969,659 B1 | 11/2005 | Anderson et al. | |
| 7,112,483 B2 | 9/2006 | Lin et al. | |
| 7,300,837 B2 | 11/2007 | Chen et al. | |
| 2009/0026505 A1* | 1/2009 | Okano | 257/255 |

FOREIGN PATENT DOCUMENTS

| | | |
|---|---|---|
| JP | 2005-086024 | 3/2005 |
| JP | 2008-277416 | 11/2008 |
| JP | 2009-032955 | 2/2009 |

OTHER PUBLICATIONS

Shang, et al. Investigation of FinFET devices for 32nm technologies and beyond, Symposium on VLSI Technology Digest of Technical Papers, pp. 66-67, 2006.
Guillorn, et al. FinFET Performance Advantage at 22nm: An AC perspective, Symposium on VLSI Technology Digest of Technical Papers, pp. 12-13, 2008.
Veloso, et al. Full-Field EUV and Immersion Lithography Integration in 0.186um2 FinFET 6T-SRAM cell, IEEE, pp. 861-864, 2008.
Kawasaki, et al. Challenges and Solution of FinFET Integration in an SRAM Cell and a Logic Circuit for 22 nm node and beyond, IEEE, pp. 289-292, 2009.

* cited by examiner

Primary Examiner — Benjamin Sandvik
Assistant Examiner — Whitney T Moore
(74) Attorney, Agent, or Firm — Turocy & Watson, LLP

(57) ABSTRACT

FinFETs and methods of making FinFETs are provided. The FinFET contains two or more fins over a semiconductor substrate; two or more epitaxial layers over side surfaces of the fins; and metal-semiconductor compounds over an upper surfaces of the epitaxial layers. The fin has side surfaces that are substantially vertical relative to the upper surface of the semiconductor substrate. The epitaxial layer has an upper surface that extends at an oblique angle with respect to the side surface of the fin. The FinFET can contain a contact over the metal-semiconductor compounds.

18 Claims, 11 Drawing Sheets

FACETED EPI SHAPE AND HALF-WRAP AROUND SILICIDE IN S/D MERGED FINFET

FIELD

The following description relates generally to fin field effect transistors (e.g., FinFETs) and methods of making FinFETs.

BACKGROUND

As transistor design is improved and evolved, the number of different types of transistors continues to increase. Multi-gate fin field effect transistors are developed to provide scaled devices with faster drive currents and reduced short channel effects over planar FETs. One feature of the FinFET is that the conducting channel is wrapped around a thin silicon "fin," which forms the body of the device. The dimensions of the fin can determine the effective channel length of the device. The term "FinFET" is used generically to describe any fin-based, multi-gate transistor architecture regardless of number of gates. Examples of multi-gate fin field effect transistors include double-gate FinFETs and tri-gate FinFETs.

Double-gate FinFETs are FETs in which a channel region is formed in a thin semiconductor fin. The source and drain regions are formed in the opposing ends of the fin on either side of the channel region. Gates are formed on each side of the thin semiconductor fin, and in some cases, on the top or bottom of the fin as well, in an area corresponding to the channel region. FinFETs are generally a type of double-gate fin FETs in which the fin is so thin as to be fully depleted.

Tri-gate FinFETs have a similar structure to that of double-gate FinFETs. The fin width and height of the tri-gate Fin-FETs, however, are approximately the same so that gates can be formed on three sides of the channel, including the top surface and the opposing sidewalls. The height to width ratio is generally in the range of 3:2 to 2:3 so that the channel will remain fully depleted and the three-dimensional field effects of a tri-gate FinFET will give greater drive current and improved short-channel characteristics over a planar transistor.

DETAILED DESCRIPTION

Figure 1A:
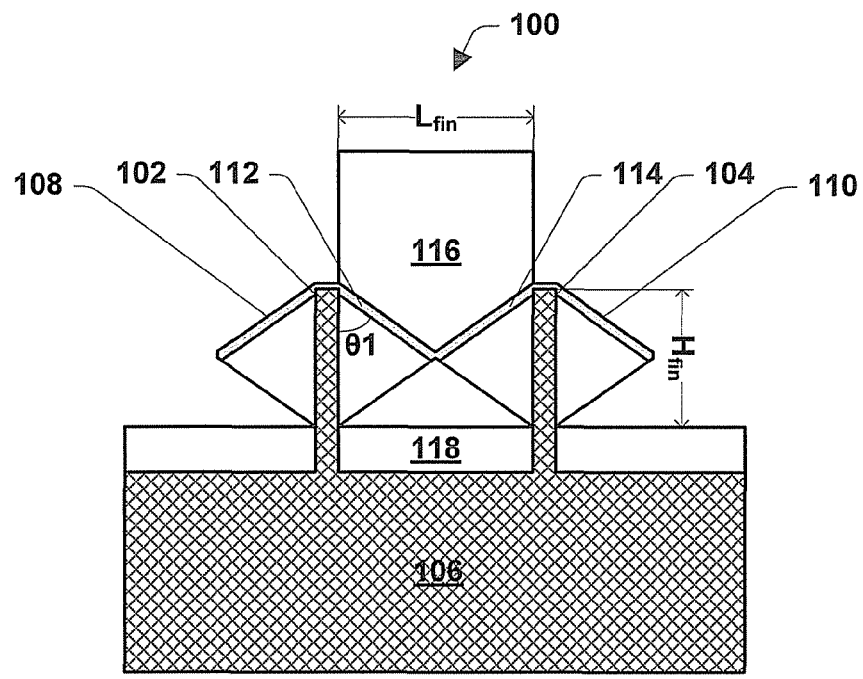
FIGS. 1 to 3 are a cross-sectional illustration of portions of exemplary FinFETs in accordance with an aspect of the subject innovation.

The subject innovation can provide FinFETs having improved characteristics of a low parasitic resistance (e.g., $R_{para}$) and/or a high drive current. The ara, FinFET can contain two or more fins over a semiconductor substrate and two or more epitaxial layers on side surfaces of the fins. The epitaxial layers have upper surfaces that extend at an oblique angle with respect to the side surface of the fin. Metal-semiconductor compounds are formed over the oblique upper surfaces of the epitaxial layers. Containing the oblique upper surfaces of the epitaxial layers, the FinFET can have a smaller distance between the channel and the metal-semiconductor compounds and a larger area of contact between the metal-semiconductor compounds and the epitaxial layer, as compared to a FinFET containing an epitaxial layer having non-oblique upper surfaces.

One aspect of the innovation provides a FinFET having improved characteristics of a low parasitic resistance (e.g., $R_{para}$) and/or a high drive current. The FinFET contains two or more fins over a semiconductor substrate; two or more epitaxial layers over side surfaces of the fins; and metal-semiconductor compounds over an upper surfaces of the epitaxial layers. The fin has side surfaces that are substantially vertical relative to the upper surface of the semiconductor substrate. The epitaxial layer has an upper surface that extends at an oblique angle with respect to the side surface of the fin and does not extend above the upper surface of the fin. The FinFET can contain a contact over the metal-semiconductor compounds.

Another aspect of the innovation relates to methods of making a FinFET. The method involves providing fins containing semiconductor materials over a semiconductor substrate; forming epitaxial layers over side surfaces of the fins; and forming metal-semiconductor compounds over the upper surface of the epitaxial layers. The epitaxial layer has an upper surface that extends at an oblique angle with respect to the side surface of the fin.

Yet another aspect of the innovation provides method of electrically connecting a fin to a contact. The method involves fondling epitaxial layers over side surfaces of the fin; forming metal-semiconductor compounds over the upper surface of the epitaxial layers; and forming the contact over the metal-semiconductor compounds. The epitaxial layer has an upper surface that extends at an oblique angle with respect to the side surface of the fin.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the disclosed information when considered in conjunction with the drawings.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices may be shown in block diagram form in order to facilitate describing the claimed subject matter.

Figure 1B:
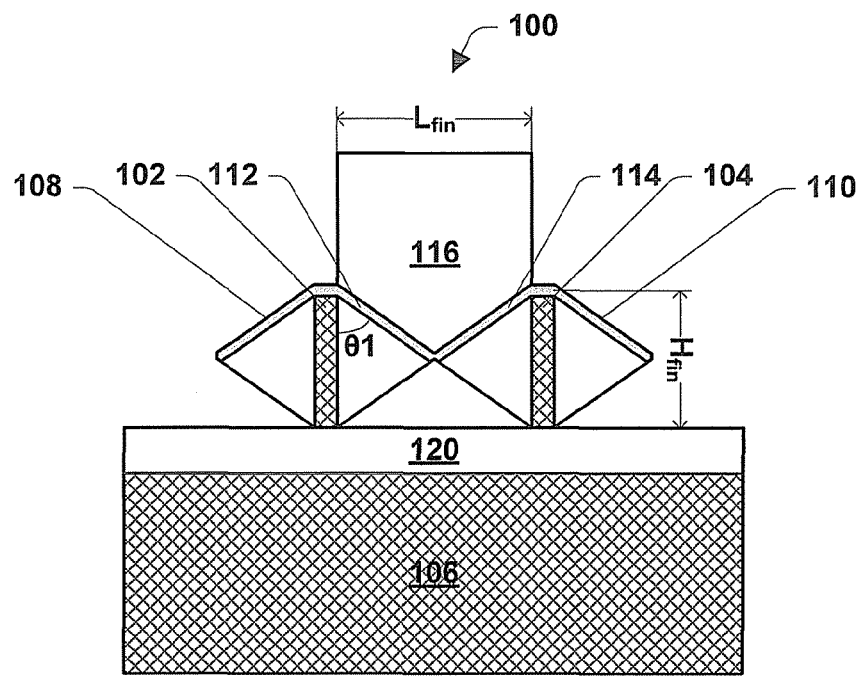

FIGS. 1A and 1B illustrate cross sectional views of a portion of exemplary FinFETs 100A, 100B. The FinFET contains two or more fins 102, 104 over a semiconductor substrate 106. The FinFET contains two or more epitaxial layers 108, 110 over side surfaces of the fins. The FinFET contains metal-semiconductor compounds 112, 114 over the upper surfaces of the epitaxial layer. The FinFET can contain a contact 116 over the oblique upper surface of the epitaxial layer. The metal-semiconductor compound electrically connects the fin to the contact. In one embodiment, the FinFET is contained only in a source/drain region of a transistor structure.

The fin contains any suitable semiconductor material (e.g., silicon). The semiconductor substrate typically contains silicon. The fin is associated with the semiconductor substrate, for example, in the same manner as described in detail in connection with FIGS. 4 to 8. In one embodiment, as illustrated in FIG. 1A, the fin is a portion of the semiconductor substrate. Such a fin can be formed by removing upper portions of the semiconductor substrate and leaving the fin. A shallow trench isolation (e.g., STI) 118 is formed between the fins and the epitaxial layers are formed over side surfaces of the fins above the upper surface of the STI. The STI can contain any suitable insulating material such as oxides (e.g., silicon oxides) and nitrides (e.g., silicon nitrides).

In another embodiment, as illustrated in FIG. 1B, the fin is formed independently from a semiconductor substrate. The fin can be formed over one or more dielectric layers 120 that are formed over the semiconductor substrate. For example, the fin is formed by forming a dielectric layer (e.g., a buried silicon oxide layer or a BOX layer) over a semiconductor substrate, forming a semiconductor layer over the dielectric layer, and removing portions of the semiconductor layer and leaving the fin.

The fin has side surfaces that are substantially vertical relative to the upper surface of the semiconductor substrate. In one embodiment, the fin has side surfaces that extend within about 20 degrees of vertical. In another embodiment, the fin has side surfaces that extend within about 10 degrees of vertical. In one embodiment, the fin has side surfaces that extend within about 5 degrees of vertical.

The fin has any suitable width that depends on the desired implementations of the FinFET structure. The width may vary and is not critical to the subject innovation. All of the fins have the same width, or some of or all of the fins have a different width from each other. In one embodiment, the width of the fin is about 5 nm or more and about 30 nm or less. In another embodiment, the width of the fin is about 10 nm or more and about 20 nm or less. In yet another embodiment, the width of the fin is about 12 nm or more and about 18 nm or less. In still yet another embodiment, the width of the fin is about 15 nm.

The fin has any suitable height ($H_{fin}$) that depends on the desired implementations of the FinFET structure. The height may vary and are not critical to the subject innovation. All of the fins have the same height, or some of or all of the fins have a different height from each other. In one embodiment, the height of the fin is about 5 nm or more and about 80 nm or less. In another embodiment, the height of the fin is about 10 nm or more and about 70 nm or less. In yet another embodiment, the height of the fin is about 15 nm or more and about 60 nm or less.

The epitaxial layer has an upper surface that is substantially oblique relative to the side surface of the fin. In another embodiment, the epitaxial layer has an upper surface that is substantially oblique relative to the upper surface of the semiconductor substrate. In other words, the upper surface extends at an oblique angle with respect to an axis which is perpendicular to the surface of the semiconductor substrate. The oblique upper surface may be referred as to a facet.

In one embodiment, the epitaxial layer contains no upper surface that is perpendicular to the side surface of the fin. In another embodiment, the epitaxial layer contains no upper surface that is parallel to the upper surface of the semiconductor substrate In yet another embodiment, the epitaxial layer contains an upper layer that contain only a (111) plane or a plane equivalent thereto (referred to collectively hereinafter as "(111) plane"). In still yet another embodiment, the epitaxial layer contains no flat-top upper surface. The epitaxial layer having the oblique upper surface can be formed by any suitable epitaxial process as described in detail below.

The upper surface extends at an oblique angle $\theta 1$ with respect to the side surface of the fin, as illustrated in FIG. 1. The upper surface does not extend above the upper surface of the fin. In one embodiment, the oblique angle $\theta 1$ is from about 30 degrees or more and about 85 degrees or less. In another embodiment, the oblique angle $\theta 1$ is from about 35 degrees or more and about 75 degrees or less. In one embodiment, the oblique angle $\theta 1$ is from about 40 degrees or more and about 65 degrees or less.

A length ($L_{fin}$) between the fins can be any suitable length that depends on the desired implementations of the FinFET structure. The adjacent fins have any suitable length therebetween so that metal-semiconductor compounds fowled over the upper surfaces of the epitaxial layers can be electrically connected to one another. In one embodiment, the fins have a length therebetween so that the epitaxial layers have a triangular cross-section and the apexes of the triangular cross-sections are electrically connected to one another. All of the epitaxial layers have the same dimension of a triangle cross-section, or some of or all of the fins have a different dimension of a triangle cross-section from each other.

When the epitaxial layer has an upper surface that extends at an oblique angle $\theta 1$ with respect to the side surface of the fin, the length between the fins is about a length calculated by multiplying a tangent of the oblique angle $\theta 1$ by a fin height ($H_{fin}$). The angle $\theta 1$ is measured away from the side surface of the fin. When the oblique angle $\theta 1$ is about 55 degrees, the length between the fins is about 1.4 times the fin height.

The metal-semiconductor compounds facilitate electrically connecting the fin with the contact. The fins can directly contact with the epitaxial layers, and the fins are electrically connected with the contact by the epitaxial layer and the metal-semiconductor material compounds. The FinFET can contain any suitable semiconductor materials in the fins and epitaxial layers, and any suitable metal-semiconductor compounds. Examples of semiconductor materials include silicon, germanium, gallium arsenide, indium phosphide, or the like. Examples of semiconductor compounds include metal silicides, metal germanides, metal germanosilicides, or the like. The fins and/or epitaxial layers can contain the same or a different semiconductor material. Although the FinFET can contain any suitable semiconductor material and metal-semiconductor compound, the subject innovation is hereinafter illustrated and described in the context of an exemplary fin and epitaxial layer containing silicon as a semiconductor material and metal silicides as metal-semiconductor compounds in some instances.

In one embodiment, the metal-semiconductor compounds are located over an entire upper surface of the epitaxial layer or some portion thereof. In another embodiment, the metal-semiconductor compounds are located over an entire upper surface of the epitaxial layer or some portion thereof, and over the upper surface of the fin.

The metal-semiconductor compound has any suitable thickness that depends on the desired implementations of the FinFET structure. The thickness may vary and are not critical to the subject innovation. The metal-semiconductor compounds over all of the epitaxial layers have the same thickness, or the metal-semiconductor compounds over some of or all of the epitaxial layers have a different thickness from each other. In one embodiment, the thickness of the metal-semiconductor compound is about 1 nm or more and about 30 nm or less. In another embodiment, the thickness of the metal-semiconductor compound is about 1 nm or more and about 20 nm or less. In yet another embodiment, the thickness of the metal-semiconductor compound is about 1 nm or more and about 10 nm or less.

The contact can electrically connect the fin to conductive layers or conductive lines (e.g., metal layers or metal lines) (not shown) via the epitaxial layer and the metal-semiconductor compound. The lower surface of the contact can be in contact with the upper surface of the metal-semiconductor compound. The lower surface of the contact can have the same oblique angle as the upper surface of the epitaxial layer.

The contact can contain any suitable conductive material such as metal material. Examples of metal materials include metals, metal alloys, or the like. Specific examples of metal materials include aluminum (Al), gold (Au), platinum (Pt), copper (Cu), silver (Ag), cobalt (Co), iridium (Ir), tungsten (W), and molybdenum (Mo), ruthenium (Ru), nickel (Ni), palladium (Pd), tantalum (Ta), titanium (Ti), and alloys thereof, or the like.

The contact can be formed by any suitable technique. For example, physical vapor deposition (PVD), chemical vapor deposition (CVD), electroplating, sputtering, evaporation, lithography, and etching techniques can be used to form the contact.

Figure 2A:
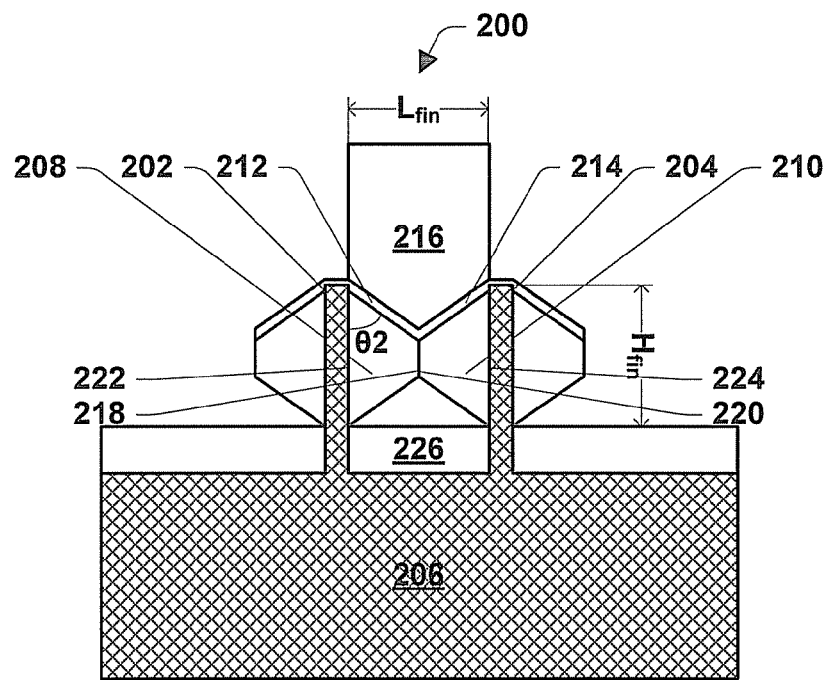
Figure 2B:
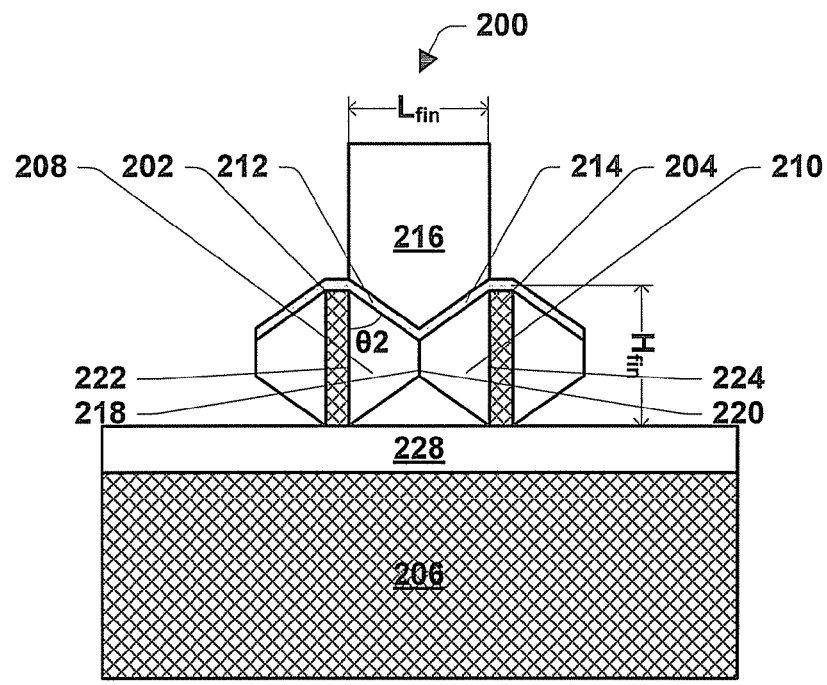

FIGS. 2A and 2B illustrate cross sectional views of a portion of other exemplary FinFETs 200. The FinFET contains two or more fins 202, 204 over a semiconductor substrate 206, two or more epitaxial layers 208, 210 on side surfaces of the fins, and metal-semiconductor compounds 212, 214 over the upper surfaces of the epitaxial layer. The FinFET can contain a contact 216 over the oblique upper surface of the epitaxial layer. The epitaxial layer has an upper surface that extends at an oblique angle with respect to the side surface of the fin. The FinFET contains such features in the same manner as described in connection with FIG. 1 except that the length between the fins can be smaller than that of the FinFET as described in connection with FIG. 1 and/or the epitaxial layer does not have a triangle cross-section of the FinFET as described in connection with FIG. 1.

The adjacent fins have any suitable length ($L_{fin}$) therebetween so that metal-semiconductor compounds formed over the upper surfaces of the epitaxial layers can be electrically connected to one another. In one embodiment, the fins have a length therebetween so that the epitaxial layers have a generally trapezoidal cross-section and a shorter side 218 of a pair of parallel sides of the trapezoidal epitaxial layer 208 formed on a side surface of a fin 202 is in contact with a shorter side 220 of a pair of parallel sides of a trapezoidal epitaxial layer 210 formed on a side surface of an adjacent fin 204.

All of the epitaxial layers have the same shape of a trapezoidal cross-section, or some of or all of the fins have a different shape of a trapezoidal cross-section from each other. The oblique upper surface contains an upper side of a pair of non-parallel sides of the trapezoidal epitaxial layer. A longer side 222, 224 of a pair of parallel sides of the trapezoidal epitaxial layer is in contact with the side surface of the fin. In one embodiment, a length of the longer side 222, 224 is about the same as the height of the fin.

When the epitaxial layer has an upper surface that extends at an oblique angle θ2 with respect to the side surface of the fin, the length ($L_{fin}$) between the fins is less than a length calculated by multiplying a tangent of the oblique angle θ2 by a fin height ($H_{fin}$). The angle θ2 is measured away from the side surface, as illustrated in FIG. 2. When the oblique angle θ2 is about 55 degrees, the length between the fins is less than about 1.4 times the fin height.

In one embodiment, the oblique angle θ2 is from about 30 degrees or more and about 85 degrees or less. In another embodiment, the oblique angle θ2 is from about 35 degrees or more and about 75 degrees or less. In one embodiment, the oblique angle θ2 is from about 40 degrees or more and about 65 degrees or less.

The fin is associated with the semiconductor substrate, for example, in the same manner as described in detail in connection with FIGS. 4 to 8. In one embodiment, as illustrated in FIG. 2A, the fin is a portion of the semiconductor substrate. A shallow trench isolation (e.g., STI) 226 is formed between the fins and the epitaxial layers are formed over side surfaces of the fins above the upper surface of the STI. In another embodiment, as illustrated in FIG. 2B, the fin is formed independently from a semiconductor substrate. The fin can be formed over one or more dielectric layers 228 that are formed over the semiconductor substrate. For example, the fin is formed by forming a dielectric layer (e.g., a buried silicon oxide layer or a BOX layer) over a semiconductor substrate, forming a semiconductor layer over the dielectric layer, and removing portions of the semiconductor layer and leaving the fin.

Figure 3A:
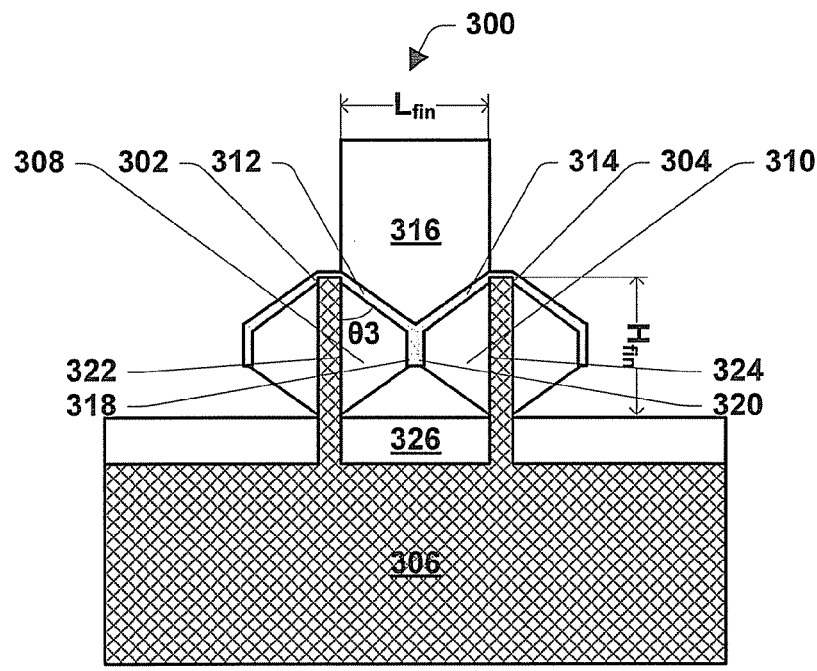
Figure 3B:
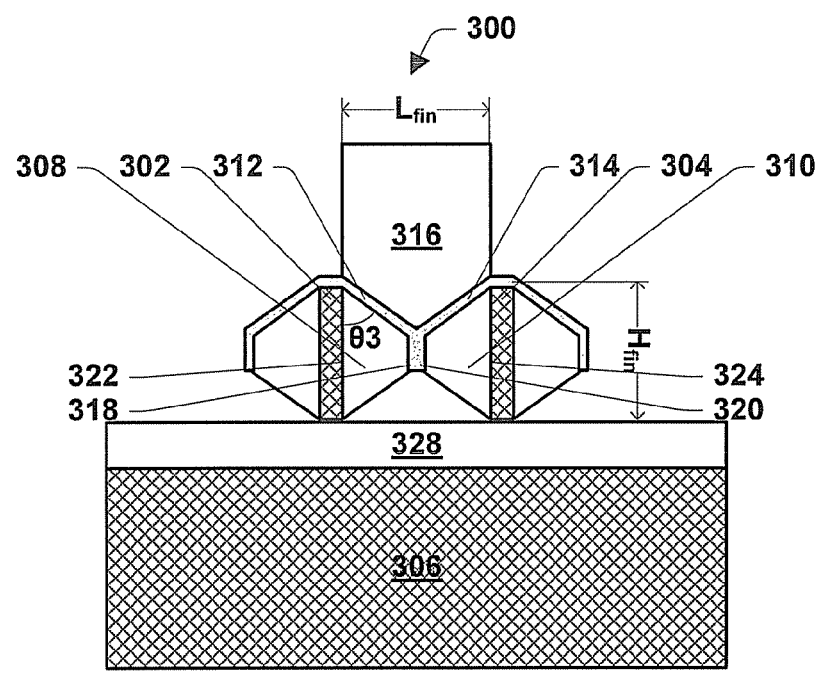

FIGS. 3A and 3B illustrate cross sectional views of a portion of yet other exemplary FinFETs 300. The FinFET contains two or more fins 302, 304 over a semiconductor substrate 306, two or more epitaxial layers 308, 310 on side surfaces of the fins, and metal-semiconductor compounds 312, 314 over the upper surfaces of the epitaxial layers. The FinFET can contain a contact 316 over the oblique upper surface of the epitaxial layer. The epitaxial layer has an upper surface that extends at an oblique angle with respect to the side surface of the fin. The FinFET contains such features in the same manner as described in connection with FIG. 1 except that the epitaxial layer has a trapezoidal cross-section and that metal-semiconductor compounds are formed over a shorter side 318, 320 of a pair of parallel sides of the trapezoidal epitaxial layer. The metal-semiconductor compounds wrap at least partially around the epitaxial layer.

The adjacent fins have any suitable length ($L_{fin}$) therebetween so that metal-semiconductor compounds formed over the upper surfaces of the epitaxial layers can be electrically connected to one another. In addition, the adjacent fins have any suitable length therebetween so that the epitaxial layers have a generally trapezoidal cross-section and metal-semiconductor compounds can be formed over the shorter side 318, 320 of a pair of parallel sides of the trapezoidal epitaxial layer. In one embodiment, the length between the fins can be the same as or smaller than that of the FinFET as described in connection with FIG. 1.

All of the epitaxial layers have the same shape of a trapezoidal cross-section, or some of or all of the fins have a different shape of a trapezoidal cross-section from each other. The oblique upper surface contains an upper side of a pair of non-parallel sides of the trapezoidal epitaxial layer. A longer side 322, 324 of a pair of parallel sides of the trapezoidal epitaxial layer is in contact with the side surface of the fin. The metal-semiconductor compounds formed over the shorter sides of adjacent epitaxial layers 318, 320 can be electrically connected to one another. In one embodiment, a length of the longer side 322, 324 is about the same as the height of the fin.

When the epitaxial layer has an upper surface that extends at an oblique angle θ3 with respect to the side surface of the fin, the length ($L_{fin}$) between the fins is about the same as or less than a length calculated by multiplying a tangent of the oblique angle θ3 by a fin height ($H_{fin}$). The angle θ3 is measured away from the side surface of the fin, as shown in FIG. 3. When the oblique angle θ3 is about 55 degrees, the length between the fins is the same as or less than about 1.4 times the fin height.

In one embodiment, the oblique angle θ3 is from about 30 degrees or more and about 85 degrees or less. In another embodiment, the oblique angle θ3 is from about 35 degrees or more and about 75 degrees or less. In one embodiment, the oblique angle θ3 is from about 40 degrees or more and about 65 degrees or less.

The fin is associated with the semiconductor substrate, for example, in the same manner as described in detail in connection with FIGS. 4 to 8. In one embodiment, as illustrated in FIG. 3A, the fin is a portion of the semiconductor substrate. A shallow trench isolation (e.g., STI) 326 is formed between the fins and the epitaxial layers are formed over side surfaces of the fins above the upper surface of the STI. In another embodiment, as illustrated in FIG. 3B, the fin is formed independently from a semiconductor substrate. The fin can be formed over one or more dielectric layers 328 that are formed over the semiconductor substrate. For example, the fin is formed by forming a dielectric layer (e.g., a buried silicon oxide layer or a BOX layer) over a semiconductor substrate, forming a semiconductor layer over the dielectric layer, and removing portions of the semiconductor layer and leaving the fin.

Referring to FIGS. 4 and 5, and FIGS. 6 to 8, two of many possible exemplary embodiments of forming fins of a FinFET are specifically illustrated. FIGS. 4 to 8 illustrate forming six fins for the purpose of illustration. Although the six fins are shown in the Figures, the subject FinFET can contain any suitable number of fins depending on a type of the FinFET.

Figure 4:
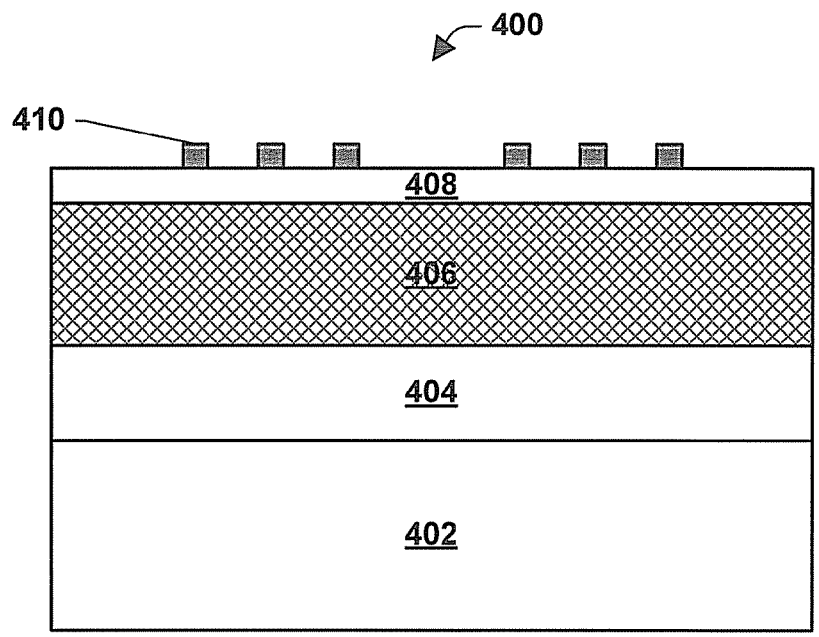
FIGS. 4 to 20 illustrate exemplary methodologies of forming fins of FinFETs in accordance with certain aspects of the subject innovation.

FIG. 4 illustrates a cross sectional view of an intermediate state of an exemplary FinFET 400. The FinFET can contain a substrate (e.g., silicon substrate) 402, a buried silicon oxide (e.g., BOX) layer 404, a semiconductor layer (e.g., silicon layer) 406, a cap layer 408, and a patterned material 410.

The patterned material 410 can be formed by any suitable technique. For example, the patterned material is formed by optical lithography, sidewall image transfer technique, or the like. Although not shown in FIG. 4, when the patterned material is formed by the sidewall image transfer technique, the patterned material can be in the shape of a triangle, trapezoid, or the like. The patterned material typically contains resists; oxides such as silicon oxide; nitrides such as silicon nitride, silicon rich nitride, and oxygen rich silicon nitride; and the like. The cap layer typically contains oxides such as silicon oxide; nitrides such as silicon nitride, silicon rich nitride, and oxygen rich silicon nitride; and the like.

Figure 5:
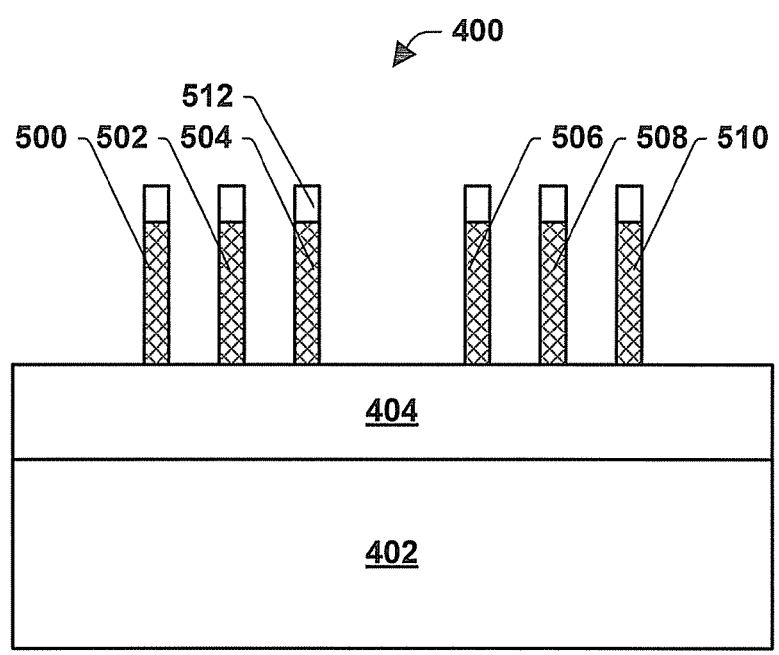

FIG. 5 illustrates forming six fins 500 to 510 from the semiconductor layer and forming six caps 512 on the fins from the cap layer. The caps and fins can be formed by removing portions of the cap layer and the semiconductor layer. The portions of the cap layer and the semiconductor layer can be removed by any suitable technique, for example, etching. For example, portions of the cap layer and the semiconductor layer are removed by contacting the cap layer and the semiconductor layer with any suitable etchant that does not substantially damage and/or remove other components of the FinFET. Choice of a suitable process and reagents of etching depends on, for example, the cap layer material, the width and height of the fins, the desired implementations of the FinFET structure being fabricated, and the like.

Wet etching and/or dry etching containing isotropic etching and/or anisotropic etching can be employed. Examples of wet etchants for the silicon of the semiconductor layer include tetraalkylammonium hydroxides (e.g., tetramethylammonium hydroxide (TMAH)) and alkali metal hydroxides (e.g., a potassium hydroxide (KOH) and cerium hydroxide (CeOH)). Examples of dry etching include reactive ion etching (RIE) using, for example, a mixture gas containing HBr (e.g., HBr and $O_2$ mixture gas, HBr/$NF_3$/He and $O_2$ mixture gas, $SF_6$, HBr and $O_2$ mixture gas). The mixture may further include $Cl_2$.

Figure 6:
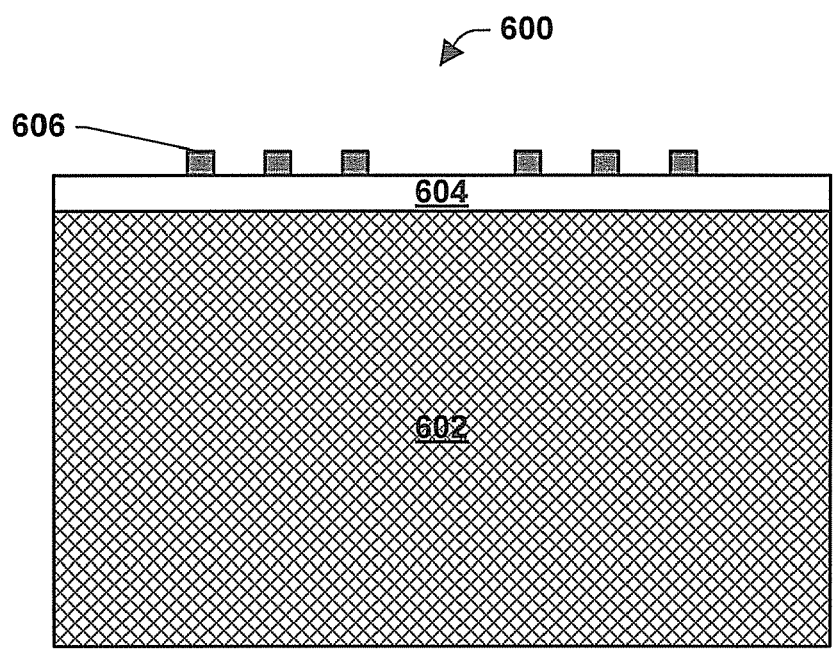
Figure 7:
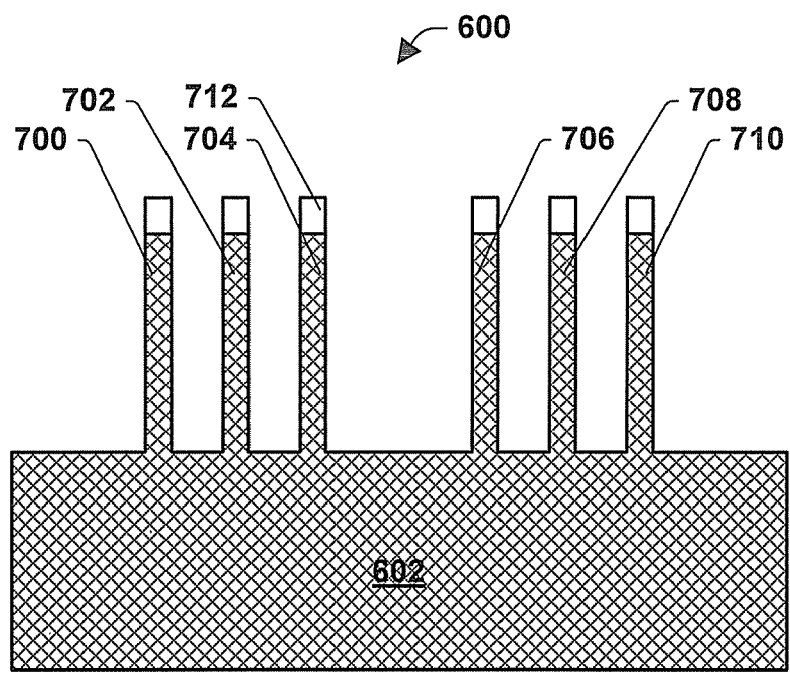
Figure 8:
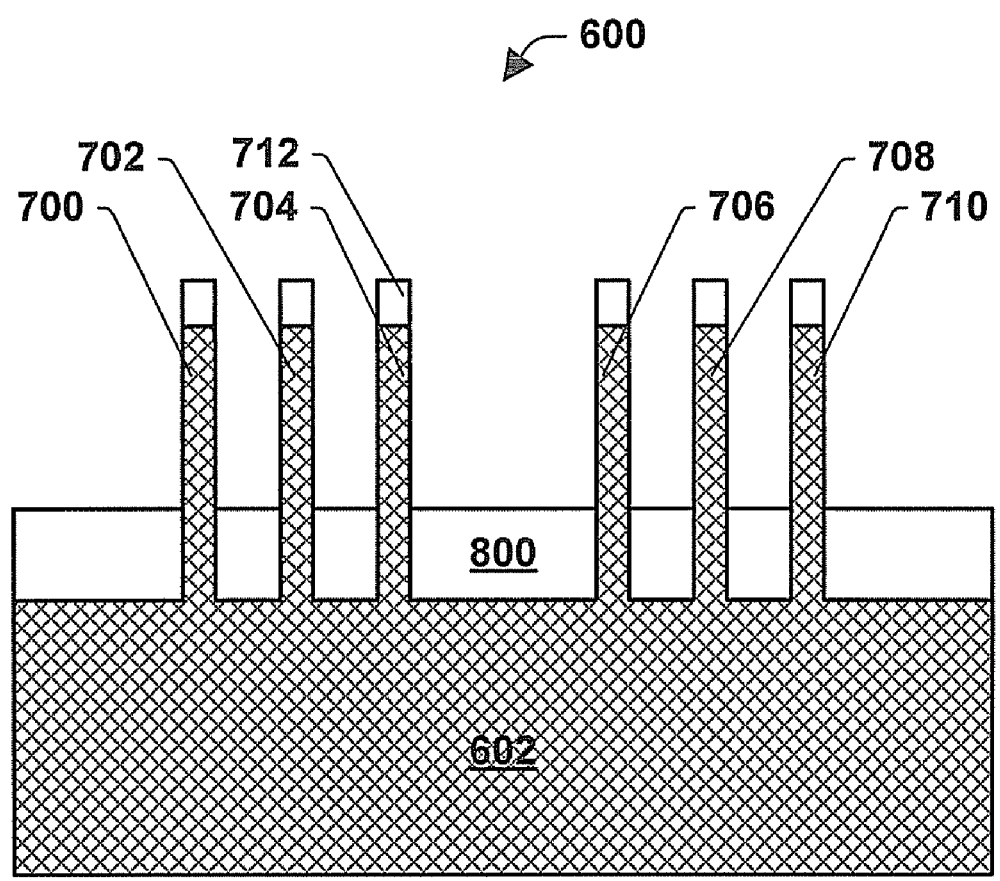

FIGS. 6 to 8 illustrate another exemplary method of making fins of a FinFET. FIG. 6 illustrates a cross sectional view of an intermediate state of a portion of an exemplary FinFET 600. The FinFET can contain a relatively thick semiconductor substrate (e.g., bulk semiconductor substrate) 602, a cap layer 604, and a patterned material 606.

FIG. 7 illustrates forming six fins 700 to 710 from a portion of the semiconductor substrate 602 and forming six caps 712 on the fins from the cap layer 604. The caps and fins can be formed by removing portions of the cap layer and portions of the semiconductor substrate via, for example, etching. The portions can be removed in the same manner as described in connection with FIG. 5.

FIG. 8 illustrates forming a shallow trench isolation (e.g., STI) 800 between the fins 700 to 710 on the semiconductor substrate 602. The STI can contain any suitable insulating material such as oxides (e.g., silicon oxides) and nitrides (e.g., silicon nitrides). The STI can be formed by any suitable technique. For example, an insulating layer (not shown) is formed over the semiconductor substrate and an upper portion of the insulating layer is removed, thereby leaving the STI between the fins.

The insulating layer can be formed by chemical vapor deposition (CVD) such as plasma enhanced chemical vapor deposition (PECVD), low-pressure chemical vapor deposition (LPCVD), high-pressure chemical vapor deposition (HPCVD), or the like. An upper portion of the insulating layer can be removed by chemical-mechanical polishing (CMP) and/or etching (e.g., reactive ion (RI) etching). For example, an upper portion of the insulating layer is polished by CMP down to the upper surface of the cap when the caps exist on the fins or down to the upper surface of the fins when caps do not exist, and then an upper portion of the insulating layer is further removed by RI etching. If a cap exists on the fin, the cap can be removed at the same time when the upper portion of the insulating layer is removed (not shown).

The height of the fin from the upper surface of the STI may vary and are not critical to the subject innovation. The height of the fin from the upper surface of the STI can be the same height as described in connection with FIG. 1.

Figure 9:
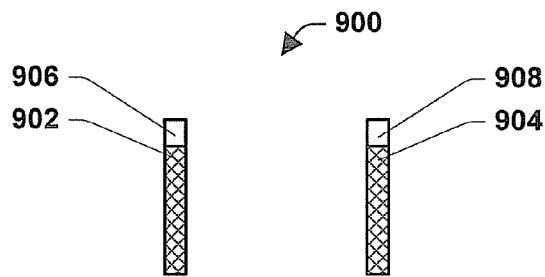
Figure 11:
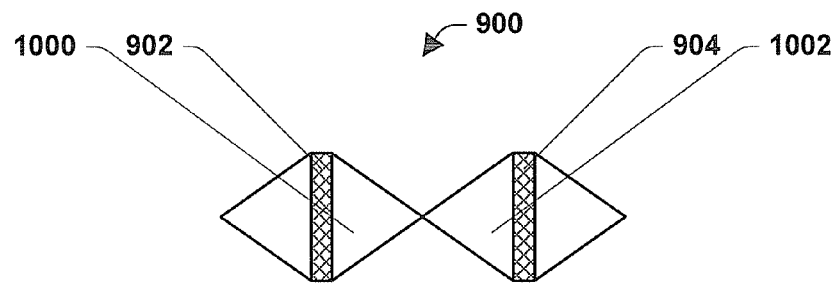
Figure 12:
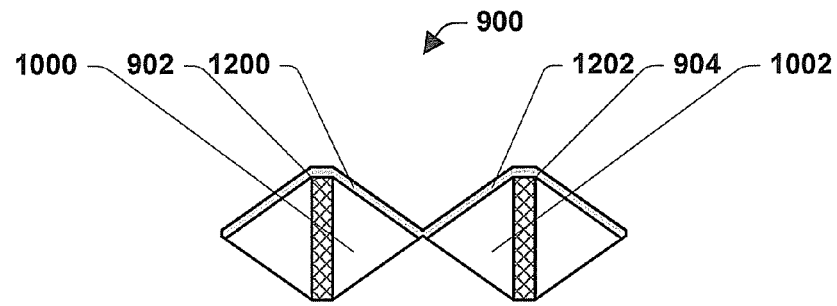
Figure 13:
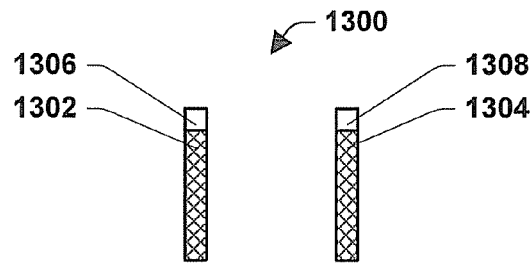
Figure 15:
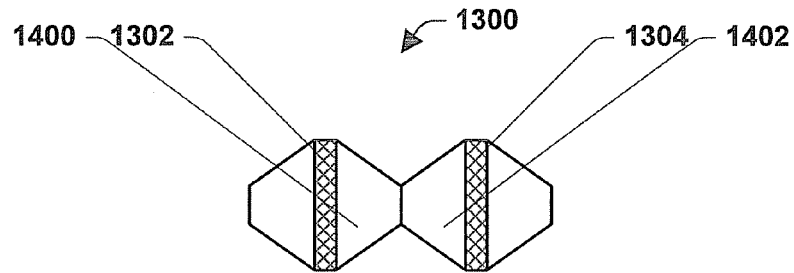
Figure 16:
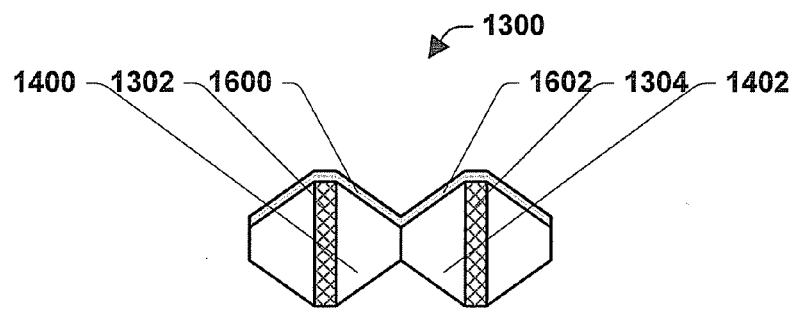
Figure 17:
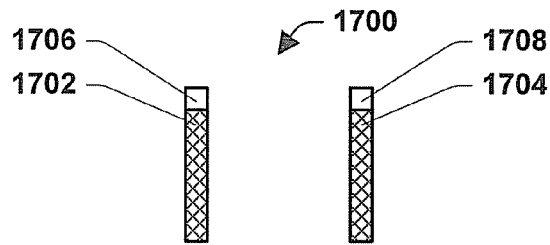

Referring to FIGS. 9 to 12, FIGS. 13 to 16, and FIGS. 17 to 20, three of many possible exemplary embodiments of forming fins of a FinFET are specifically illustrated. The fins illustrated in FIGS. 9, 13, and 17 can be formed in the same manner as described in connection with FIGS. 4 to 8. In other words, FIGS. 9, 13, and 17 illustrate two fins of the six fins formed in the same manner as described in connection with FIGS. 4 to 8. Therefore, although a semiconductor substrate is not shown in FIGS. 9 to 20, the FinFETs in FIGS. 9 to 20 contain a semiconductor substrate associated with the fins in the same manner as described in connection with FIGS. 4 to 8.

FIG. 9 illustrates a cross sectional view of an intermediate state of a portion of an exemplary FinFET 900. The FinFET contains fins 902, 904 and caps 906, 908 over the upper surfaces of the fins. The fin has side surfaces that can be substantially vertical relative to the upper surface of the semiconductor substrate.

Figure 10:
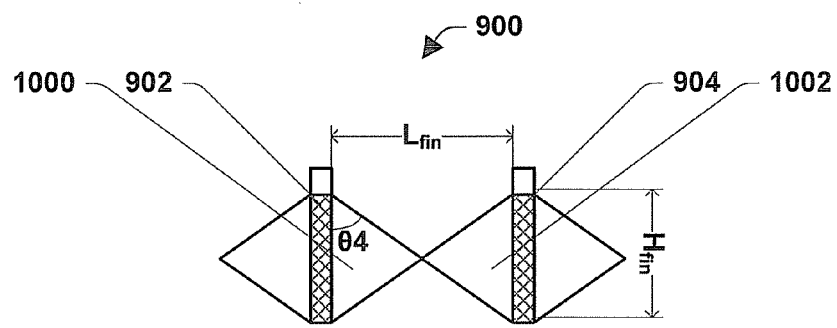

FIG. 10 illustrates forming epitaxial layers 1000, 1002 over the side surfaces of the fins. The epitaxial layer has an upper surface that is substantially oblique relative to the side surface of the fin. The epitaxial layers do not extend above the upper surface of the fin. The epitaxial layer has an upper surface that extends at an oblique angle θ4 with respect to the side surface of the fin. In this example, the fins have a length ($L_{fin}$) therebetween so that the epitaxial layers have a triangular cross-section and the apexes of the triangular cross-sections are electrically connected to one another. The length between the fins can be the same as a length calculated by multiplying a tangent of the oblique angle θ4 by a fin height ($H_{fin}$). When the oblique angle θ4 is about 55 degrees, the length between the fins is about 1.4 times the fin height.

In one embodiment, the epitaxial layer contains no upper surface that is perpendicular to the side surface of the fin or that is parallel to the upper surface of the semiconductor substrate. In another embodiment, the epitaxial layer contains an upper layer that contain only a (111) plane or a plane equivalent thereto (referred to collectively hereinafter as "(111) plane"). In yet another embodiment, the epitaxial layer contains no flat-top upper surface.

The epitaxial layer having the oblique upper surface can be formed by any suitable epitaxial process. Choice of a suitable process and reagents depends on, for example, the material of the epitaxial layer, the width and height of the fins, the desired implementations of the FinFET structure being fabricated. When the fin contains silicon, silicon epitaxial layer can be formed on the side surfaces of the fins by silicon epitaxial growth. The silicon epitaxial growth can proceed under any suitable condition, for example, at elevated temperatures (e.g., about 750 degrees Celsius using $SiCl_4$ as a source gas and $H_2$ as a carrier gas).

The silicon epitaxial growth can be selectively formed on the side surface of the fin when a cap exists on the top of the fin. Epitaxial growth is not formed on the upper surface of the fin. In one embodiment, the epitaxial growth is formed over the entire side surface of the fin. In this instance, a length of a side of the triangular cross-section that is in contact with the side surface of the fin is about the same as the height of the fin. In another embodiment, the epitaxial growth is formed over a portion of the side surface of the fin (not shown). In this instance, a length of a side of the triangular cross-section that is in contact with the side surface of the fin is shorter than the height of the fin.

FIG. 11 illustrates removing the cap layers. The cap layers can be removed by any suitable technique. For example, the cap layers are removed by contacting the cap layers with any suitable etchant that does not substantially damage and/or remove other components of the FinFET.

FIG. 12 illustrates forming metal-semiconductor compounds (e.g., metal silicides) 1200, 1202 over the upper surfaces of the epitaxial layers. The metal-semiconductor compounds can be also formed on the upper surfaces of the fins. Forming the metal-semiconductor compounds on the upper surfaces of the epitaxial layers, the adjacent fin is electrically connected to a contact (not shown) via the metal-semiconductor compounds.

The metal-semiconductor compound can be formed on the upper surface of the epitaxial layer by any suitable technique. When the epitaxial layer contains silicon, metal silicides can be formed by a silicidation process. The metal silicides can be formed by forming a metal layer (not shown) over the upper surfaces of the epitaxial layer and/or the fins by spattering, for example, and heating the metal layer to cause a chemical reaction between the metal layer and the underlying silicon. During the silicidation process, the metal of the metal layer can diffuse into the underlying silicon and form metal silicides.

Choice of suitable conditions and parameters of the silicidation process depends on, for example, the thickness of the resultant metal silicides, the configuration and/or constituent of the epitaxial layer, the desired implementations of the FinFET structure being fabricated, and the like. For example, the metal silicides are formed by rapid thermal annealing (RTA).

FIG. 13 illustrates a cross sectional view of an intermediate state of a portion of an exemplary FinFET 1300 in the same manner as described in connection with FIG. 9. The FinFET contains fins 1302, 1304 and caps 1306, 1308 over the upper surfaces of the fins. The fin has side surfaces that can be substantially vertical relative to the upper surface of the semiconductor substrate.

Figure 14:
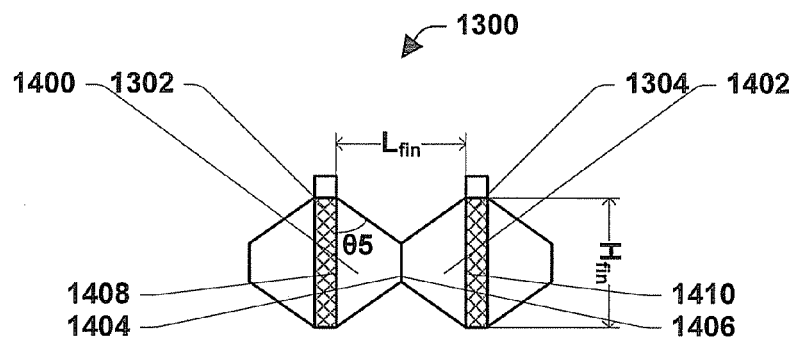

FIG. 14 illustrates forming epitaxial layers 1400, 1402 over the side surfaces of the fins. The epitaxial layer has an upper surface that is substantially oblique relative to the side surface of the fin. The epitaxial layer can be formed over the side surfaces of the fins by any suitable technique. In one embodiment, the epitaxial layer is formed in the same manner as described in connection with FIG. 10.

In this example, the fins have a length ($L_{fin}$) therebetween so that the epitaxial layers have a generally trapezoidal cross-section and a shorter side 1404 of a pair of parallel sides of the trapezoidal epitaxial layer 1400 formed on a side surface of a fin 1302 is in contact with a shorter side 1406 of a pair of parallel sides of a trapezoidal epitaxial layer 1402 formed on a side surface of an adjacent fin 1304. A longer side 1408, 1410 of a pair of parallel sides of the trapezoidal epitaxial layer is in contact with the side surface of the fin. The epitaxial layer has an upper surface that extends at an oblique angle θ5 with respect to the side surface of the fin. When the epitaxial layer has an upper surface that extends at an oblique angle θ5 with respect to the side surface of the fin, the length ($L_{fin}$) between the fins is less than a length calculated by multiplying a tangent of the oblique angle θ5 by a fin height ($H_{fin}$). When the oblique angle θ5 is about 55 degrees, the length between the fins is less than about 1.4 times the fin height.

The silicon epitaxial growth can be selectively formed on the side surface of the fin when a cap exists on the top of the fin. The epitaxial growth is not formed on the upper surface of the fin. In one embodiment, the epitaxial growth is formed over the entire side surface of the fin. In this instance, a length of a longer side of a pair of parallel sides of the trapezoidal cross-section that is in contact with the side surface of the fin is about the same as the height of the fin. In another embodiment, the epitaxial growth is formed over a portion of the side surface of the fin (not shown). In this instance, a length of a longer side of a pair of parallel sides of the trapezoidal cross-section that is in contact with the side surface of the fin is shorter than the height of the fin.

FIG. 15 illustrates removing the cap layers. FIG. 16 illustrates forming metal-semiconductor compounds (e.g., metal silicides) 1600, 1602 over the upper surfaces of the epitaxial layers. The metal-semiconductor compound can be formed by any suitable technique, for example, in the same manner as described in connection with FIG. 12.

FIG. 17 illustrates a cross sectional view of an intermediate state of a portion of an exemplary FinFET 1700 in the same manner as described in connection with FIG. 9. The FinFET contains fins 1702, 1704 and caps 1706, 1708 over the upper surfaces of the fins. The fin has side surfaces that can be substantially vertical relative to the upper surface of the semiconductor substrate.

Figure 18:
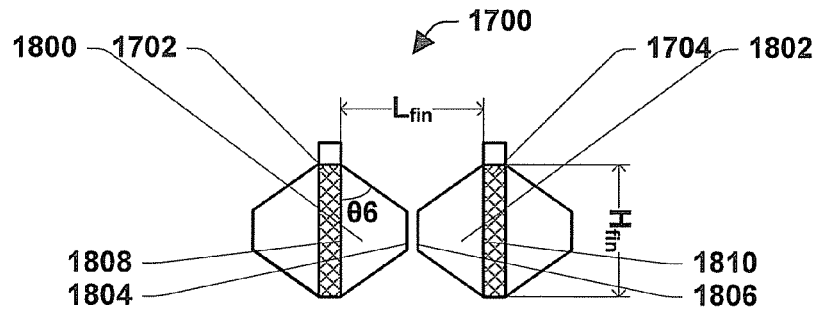

FIG. 18 illustrates forming epitaxial layers 1800, 1802 over the side surfaces of the fins. The epitaxial layer has an upper surface that is substantially oblique relative to the side surface of the fin. The epitaxial layer can be formed over the side surfaces of the fins by any suitable technique, for example, in the same manner as described in connection with FIGS. 10 and 14.

In this example, the fins have a length ($L_{fin}$) therebetween so that the epitaxial layers have a generally trapezoidal cross-section and a shorter side 1804 of a pair of parallel sides of the trapezoidal epitaxial layer 1800 formed on a side surface of a fin 1702 is not in contact with a shorter side 1806 of a pair of parallel sides of a trapezoidal epitaxial layer 1802 formed on a side surface of an adjacent fin 1704. A longer side 1808, 1810 of a pair of parallel sides of the trapezoidal epitaxial layer is in contact with the side surface of the fin.

The shorter sides 1804, 1806 are apart from each other so that metal-semiconductor compounds are formed over the shorter sides of the trapezoidal epitaxial layers in a subsequent process. In one embodiment, the shorter sides are about 0.5 nm or more and about 20 nm or less apart from each other. In another embodiment, the shorter sides are about 0.5 nm or more and about 15 nm or less apart from each other. In yet another embodiment, the shorter sides are about 0.5 nm or more and about 10 nm or less apart from each other.

The epitaxial layer has an upper surface that extends at an oblique angle $\theta 6$ with respect to the side surface of the fin. When the epitaxial layer has an upper surface that extends at an oblique angle $\theta 6$ with respect to the side surface of the fin, the length ($L_{fin}$) between the fins is the same as or less than a length calculated by multiplying a tangent of the oblique angle $\theta 5$ by a fin height ($H_{fin}$). When the oblique angle $\theta 6$ is about 55 degrees, the length between the fins is the same as or less than about 1.4 times the fin height.

Figure 19:
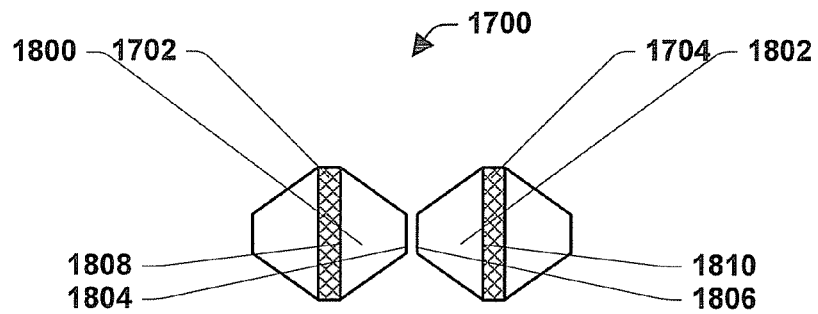
Figure 20:
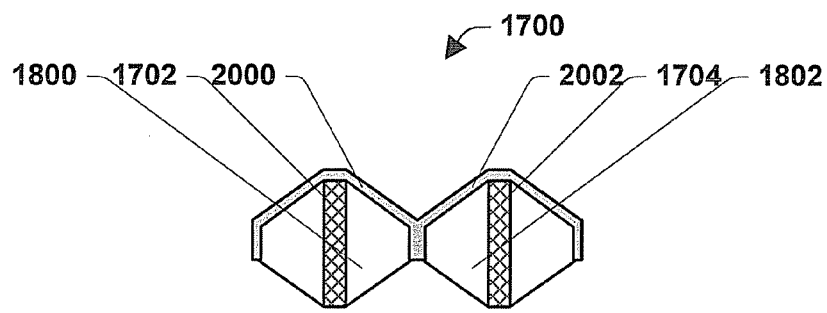

FIG. 19 illustrates removing the cap layers. FIG. 20 illustrates forming metal-semiconductor compounds (e.g., metal silicides) 2000, 2002 on the upper surfaces of the epitaxial layers and over shorter sides 1804, 1806 of a pair of parallel sides of the trapezoidal epitaxial layers. The metal-semiconductor compounds formed over the upper surfaces of the epitaxial layers can be electrically connected to one another in part by the portions of the metal-semiconductor compounds over the shorter sides of a pair of parallel sides of the trapezoidal epitaxial layers. Forming the metal-semiconductor compounds over the shorter sides of a pair of parallel sides of the trapezoidal epitaxial layers, the adjacent epitaxial layers 1800, 1802 are electrically connected from each other. The metal-semiconductor compound can be formed by any suitable technique, for example, in the same manner as described in connection with FIG. 12.

Figure 21:
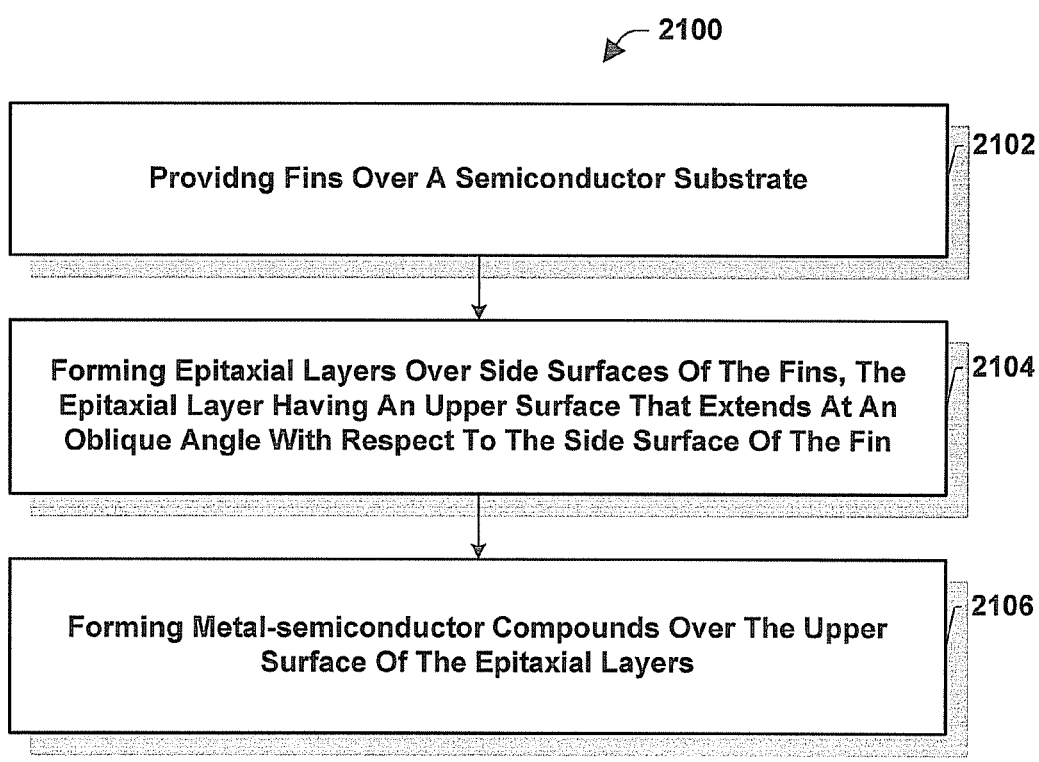
FIG. 21 is a flow diagram of an exemplary methodology of forming fins of a FinFET in accordance with an aspect of the subject innovation.

FIG. 21 illustrates an exemplary methodology 2100 of forming a FinFET. At 2102, fins are provided over a semiconductor substrate. The fin contains semiconductor materials. At 2104, epitaxial layers are formed over side surfaces of the fins. The epitaxial layer has an upper surface that extends at an oblique angle with respect to the side surface of the fin. At 2106, metal-semiconductor compounds are formed over the upper surface of the epitaxial layers.

Although not shown in FIG. 21, the methodology can involve one or more of the following features. The epitaxial layers have a triangular cross-section and the apexes of the triangular cross-sections are electrically connected to one another. The epitaxial layers have a trapezoidal cross-section and a shorter side of a pair of parallel sides of the trapezoidal epitaxial layer over a side surface of a fin is in contact with a shorter side of a pair of parallel sides of the trapezoidal epitaxial layer over a side surface of an adjacent fin. The epitaxial layer has a trapezoidal cross-section and the metal-semiconductor compounds are formed over a shorter side of a pair of parallel sides of the trapezoidal epitaxial layer. The upper surface of the epitaxial layer contains only a (111) plane.

Figure 22:
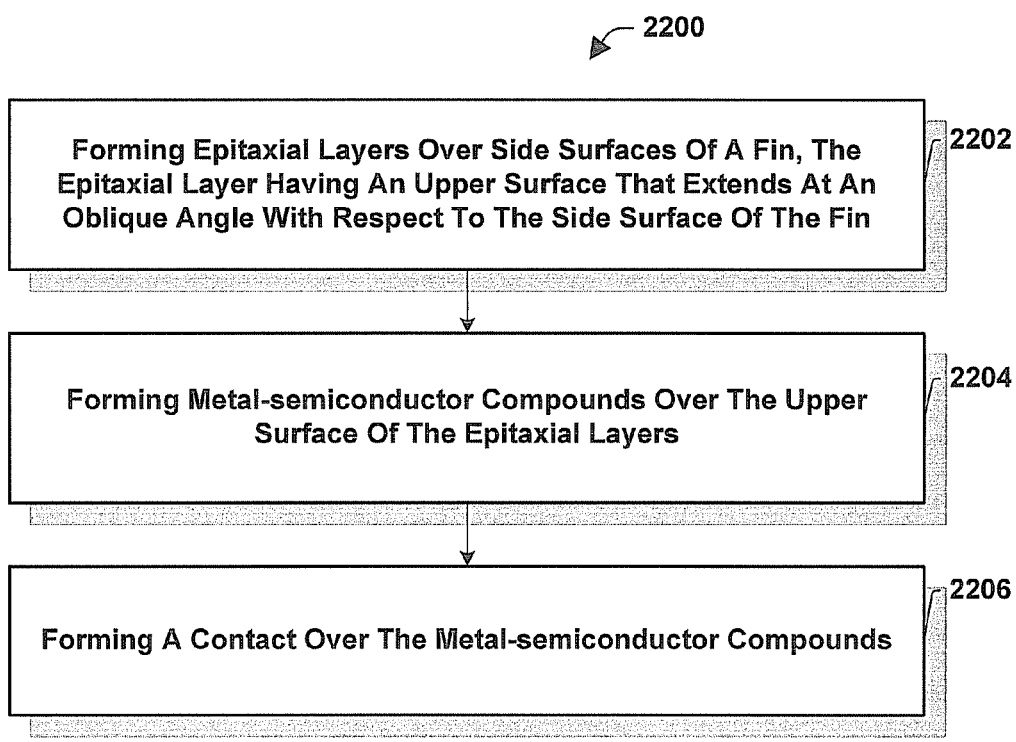
FIG. 22 is a flow diagram of another exemplary methodology of electrically connecting a fin to a contact in accordance with an aspect of the subject innovation.

FIG. 22 illustrates an exemplary methodology 2200 of electrically connecting a fin to a contact. At 2202, epitaxial layers are formed over side surfaces of the fin. The epitaxial layer has an upper surface that extends at an oblique angle with respect to the side surface of the fin. At 2204, metal-semiconductor compounds are formed over the upper surface of the epitaxial layers. At 2206, the contact is formed over the metal-semiconductor compounds.

Although not shown in FIG. 22, the methodology can involve one or more of the following features. The epitaxial layers have a triangular cross-section and the apexes of the triangular cross-sections are electrically connected to one another. The epitaxial layers have a trapezoidal cross-section and a shorter side of a pair of parallel sides of the trapezoidal epitaxial layer over a side surface of a fin is in contact with a shorter side of a pair of parallel sides of the trapezoidal epitaxial layer over a side surface of an adjacent fin. The epitaxial layers have a trapezoidal cross-section and the metal-semiconductor compounds are formed over a shorter side of a pair of parallel sides of the trapezoidal epitaxial layer. The length between the fins is about the same as or less than a length calculated by multiplying a tangent of the oblique angle by a fin height.

What has been described above includes examples of the disclosed innovation. It is, of course, not possible to describe every conceivable combination of components or methodologies for purposes of describing the disclosed innovation, but one of ordinary skill in the art can recognize that many further combinations and permutations of the disclosed innovation are possible. Accordingly, the disclosed innovation is intended to embrace all such alterations, modifications and variations that fall within the spirit and scope of the appended claims. Furthermore, to the extent that the term "contain," "includes," "has," "involve," or variants thereof is used in either the detailed description or the claims, such term can be inclusive in a manner similar to the term "comprising" as "comprising" is interpreted when employed as a transitional word in a claim.

What is claimed is:

1. A FinFET, comprising:
   two or more fins over a semiconductor substrate, the fin having side surfaces that are substantially vertical relative to the upper surface of the semiconductor substrate;
   two or more epitaxial layers over side surfaces of the fins, the epitaxial layer having an upper surface that extends at an oblique angle with respect to the side surface of the fin and does not extend above the upper surface of the fin;
   metal-semiconductor compounds over the upper surfaces of the epitaxial layer; and
   a contact over the oblique upper surface of the epitaxial layer, a lower surface of the contact being in contact with the metal-semiconductor compounds and the lower surface of the contact have the same oblique angle as the upper surface of the epitaxial layer.

2. The FinFET of claim 1, wherein the epitaxial layers have a triangular cross-section and the apexes of the triangular cross-sections are electrically connected to one another.

3. The FinFET of claim 1, wherein the epitaxial layers have a trapezoidal cross-section and a shorter side of a pair of parallel sides of the trapezoidal epitaxial layer over a side surface of a fin is in contact with a shorter side of a pair of parallel sides of the trapezoidal epitaxial layer over a side surface of an adjacent fin.

4. The FinFET of claim 1, wherein the epitaxial layer has a trapezoidal cross-section and the metal-semiconductor compounds are formed over a shorter side of a pair of parallel sides of the trapezoidal epitaxial layer.

5. The FinFET of claim 1, with the proviso that the epitaxial layers comprise no flat-top upper surface.

6. The FinFET of claim 1, wherein the upper surface of the epitaxial layer comprises only a (111) plane.

7. The FinFET of claim 1, wherein the length between the fins is about the same as or less than a length calculated by multiplying a tangent of the oblique angle by a fin height.

8. The FinFET of claim 1, wherein the length between the fins is about less than a length calculated by multiplying a tangent of the oblique angle by a fin height.

9. A method of forming a FinFET, comprising:
providing fins comprising semiconductor materials over a semiconductor substrate;
forming epitaxial layers over side surfaces of the fins, the epitaxial layer having an upper surface that extends at an oblique angle with respect to the side surface of the fin;
forming metal-semiconductor compounds over the upper surface of the epitaxial layers; and
forming a contact over the oblique upper surface of the epitaxial layer, a lower surface of the contact being in contact with the metal-semiconductor compounds and the lower surface of the contact having the same oblique angle as the upper surface of the epitaxial layer.

10. The method of claim 9, wherein the epitaxial layers have a triangular cross-section and the apexes of the triangular cross-sections are electrically connected to one another.

11. The method of claim 9, wherein the epitaxial layers have a trapezoidal cross-section and a shorter side of a pair of parallel sides of the trapezoidal epitaxial layer over a side surface of a fin is in contact with a shorter side of a pair of parallel sides of the trapezoidal epitaxial layer over a side surface of an adjacent fin.

12. The method of claim 9, wherein the epitaxial layer has a trapezoidal cross-section and the metal-semiconductor compounds are formed over a shorter side of a pair of parallel sides of the trapezoidal epitaxial layer.

13. The method of claim 9, wherein the upper surface of the epitaxial layer comprises only a (111) plane.

14. A method of electrically connecting a fin to a contact, comprising:
forming epitaxial layers over side surfaces of the fin, the epitaxial layer having an upper surface that extends at an oblique angle with respect to the side surface of the fin;
forming metal-semiconductor compounds over the upper surface of the epitaxial layers; and
forming the contact over the metal-semiconductor compounds.

15. The method of claim 14, wherein the epitaxial layers have a triangular cross-section and the apexes of the triangular cross-sections are electrically connected to one another.

16. The method of claim 14, wherein the epitaxial layers have a trapezoidal cross-section and a shorter side of a pair of parallel sides of the trapezoidal epitaxial layer over a side surface of a fin is in contact with a shorter side of a pair of parallel sides of the trapezoidal epitaxial layer over a side surface of an adjacent fin.

17. The method of claim 14, wherein the epitaxial layer has a trapezoidal cross-section and the metal-semiconductor compounds are formed over a shorter side of a pair of parallel sides of the trapezoidal epitaxial layer.

18. The method of claim 14, wherein the length between the fins is about the same as or less than a length calculated by multiplying a tangent of the oblique angle by a fin height.

* * * * *